US008975668B2

(12) United States Patent
Costello et al.

(10) Patent No.: US 8,975,668 B2
(45) Date of Patent: Mar. 10, 2015

(54) BACKSIDE-THINNED IMAGE SENSOR USING $AL_2O_3$ SURFACE PASSIVATION

(75) Inventors: Kenneth A. Costello, Union City, CA (US); Edward Yin, Cupertino, CA (US); Michael Wayne Pelczynski, Hayward, CA (US); Verle W. Aebi, Menlo Park, CA (US)

(73) Assignee: Intevac, Inc., Santa Clara, CA (US)

( * ) Notice: Subject to any disclaimer, the term of this patent is extended or adjusted under 35 U.S.C. 154(b) by 0 days.

(21) Appl. No.: 13/620,476

(22) Filed: Sep. 14, 2012

(65) Prior Publication Data

US 2013/0105928 A1   May 2, 2013

Related U.S. Application Data

(60) Provisional application No. 61/553,097, filed on Oct. 28, 2011.

(51) Int. Cl.
*H01L 27/146* (2006.01)
(52) U.S. Cl.
CPC ...... *H01L 27/14603* (2013.01); *H01L 27/1463* (2013.01); *H01L 27/1464* (2013.01)
USPC .............. 257/228; 257/E21.569; 257/E27.15; 438/73
(58) Field of Classification Search
CPC ................... H01L 27/14601; H01L 27/14643
USPC ................ 257/228, E21.569, E27.15; 438/73
See application file for complete search history.

(56) References Cited

U.S. PATENT DOCUMENTS

| 4,687,922 | A | 8/1987 | Lemonier et al. |
| 5,005,063 | A | 4/1991 | Janesick |
| 5,501,893 | A | 3/1996 | Laermer et al. |
| 6,225,670 | B1 | 5/2001 | Dierickx |
| 6,285,018 | B1 * | 9/2001 | Aebi et al. ................. 250/214.1 |
| 6,498,073 | B2 | 12/2002 | Sarma et al. |
| 6,814,833 | B2 | 11/2004 | Sabia |
| 7,005,637 | B2 | 2/2006 | Costello et al. |
| 7,485,940 | B2 * | 2/2009 | Hsu et al. ...................... 257/447 |

(Continued)

OTHER PUBLICATIONS

Wu, S.G., "A Manufacturable Back-Side Illumination Technology using Bulk-Si Substrate for Advanced CMOS Image Sensor", Jun. 2009, proc. International Image Sensor Workshop.*

(Continued)

*Primary Examiner* — John C Ingham
(74) *Attorney, Agent, or Firm* — Nixon Peabody LLP; Joseph Bach, Esq.

(57) ABSTRACT

A structure and method of manufacture is disclosed for a backside thinned imager that incorporates a conformal, $Al_2O_3$, low thermal budget, surface passivation. This passivation approach facilitates fabrication of backside thinned, backside illuminated, silicon image sensors with thick silicon absorber layer patterned with vertical trenches that are formed by etching the exposed back surface of a backside-thinned image sensor to control photo-carrier diffusion and optical crosstalk. A method of manufacture employing conformal, $Al_2O_3$, surface passivation approach is shown to provide high quantum efficiency and low dark current while meeting the thermal budget constraints of a finished standard foundry-produced CMOS imager.

16 Claims, 6 Drawing Sheets

(56) References Cited

U.S. PATENT DOCUMENTS

| | | | |
|---|---|---|---|
| 7,800,192 B2 * | 9/2010 | Venezia et al. | 257/432 |
| 8,183,510 B2 * | 5/2012 | Venezia et al. | 250/208.1 |
| 8,283,195 B2 * | 10/2012 | Meynants | 438/57 |
| 2003/0137243 A1 | 7/2003 | Costello | |
| 2008/0254565 A1 | 10/2008 | Liu | |
| 2009/0294811 A1 | 12/2009 | Rhodes et al. | |
| 2010/0006908 A1 * | 1/2010 | Brady | 257/291 |
| 2010/0137143 A1 | 6/2010 | Rothberg et al. | |
| 2011/0013055 A1 * | 1/2011 | Sul et al. | 348/273 |
| 2011/0024810 A1 | 2/2011 | Janesick | |
| 2011/0101482 A1 | 5/2011 | Meynants | |
| 2011/0140246 A1 | 6/2011 | Hoenk et al. | |

OTHER PUBLICATIONS

International Search Report and Written Opinion in International Application No. PCT/US2012/55658, mailed on Nov. 30, 2012.

Cheng, C., et al., "In situ metal-organic chemical vapor deposition atomic-layer deposition of aluminum oxide on GaAs using trimethyaluminum and isopropanol precursors," Applied Physics Letters 93, 031902, Jul. 2008.

* cited by examiner

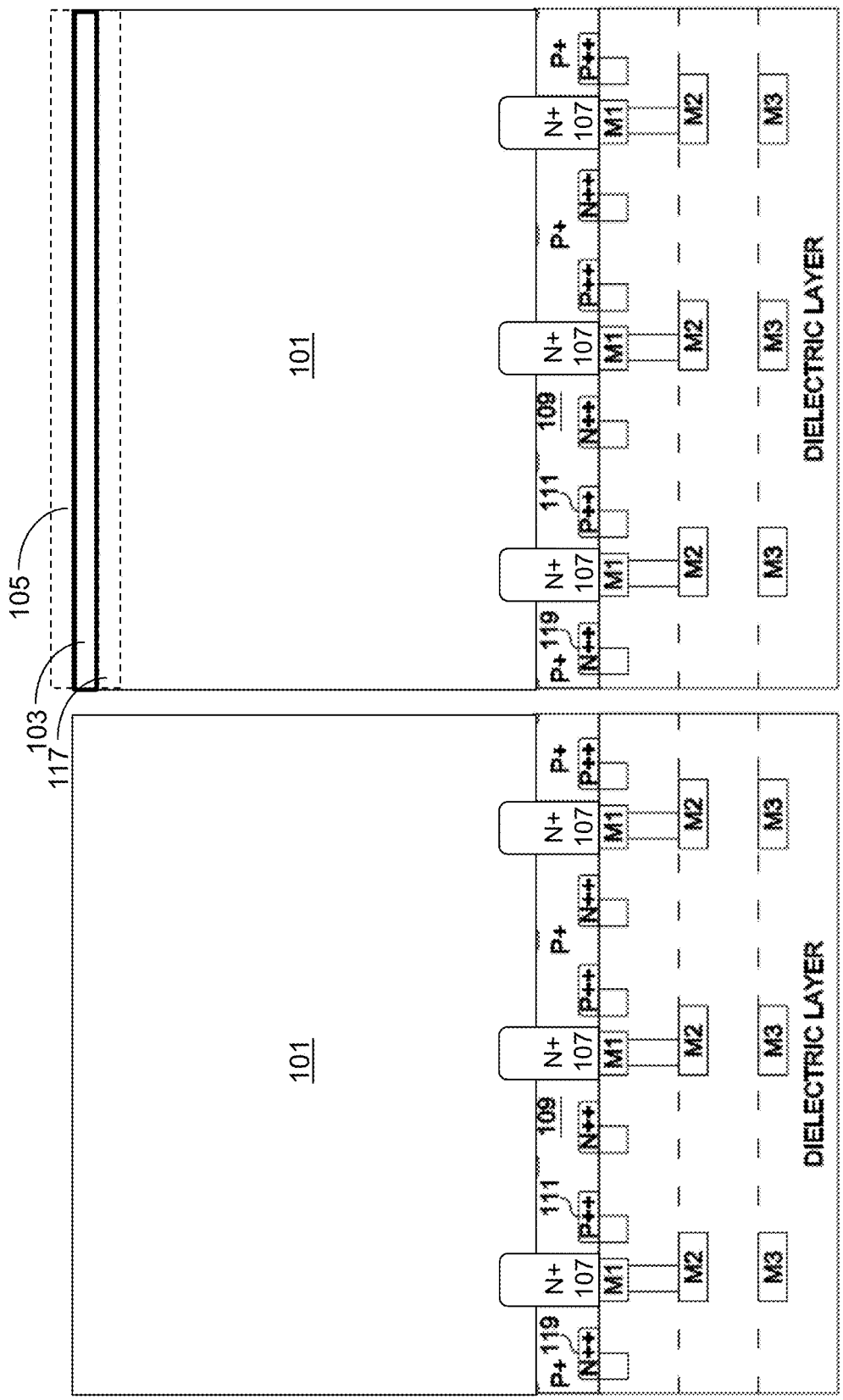

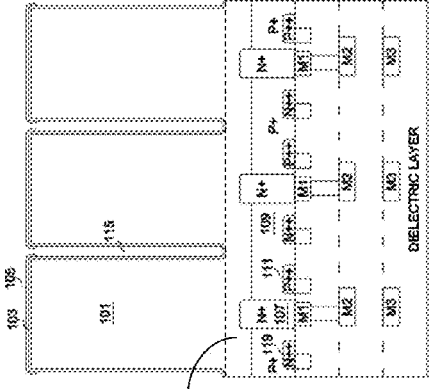
Fig. 1A
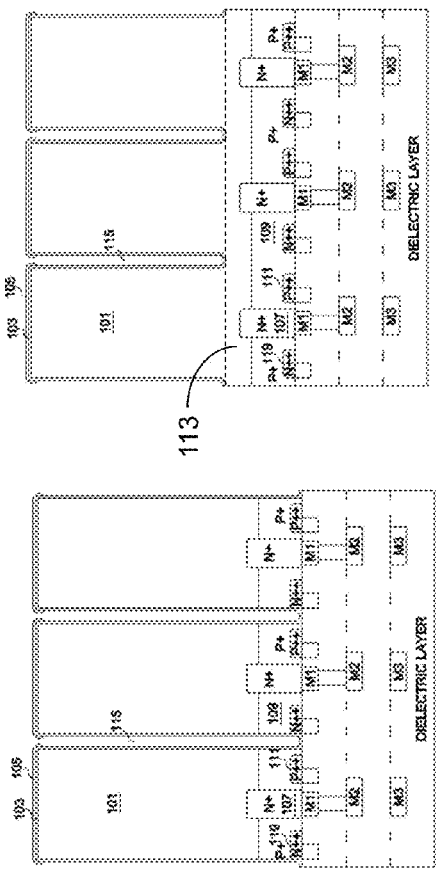
Fig. 1B
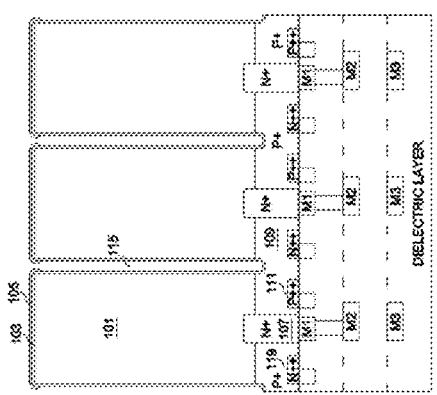
Fig. 1C
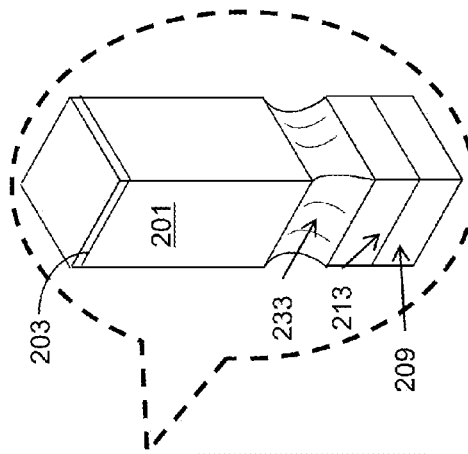
Fig. 2A
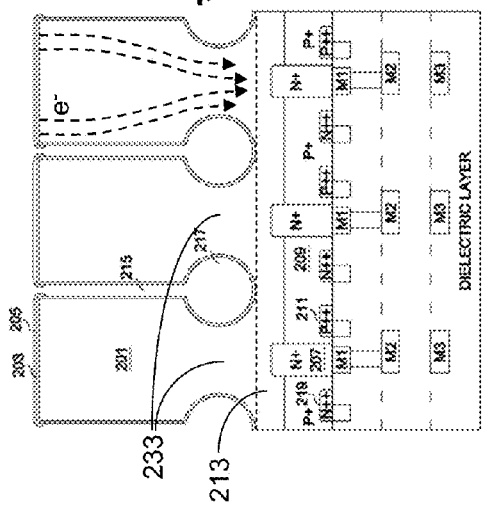
Fig. 2B
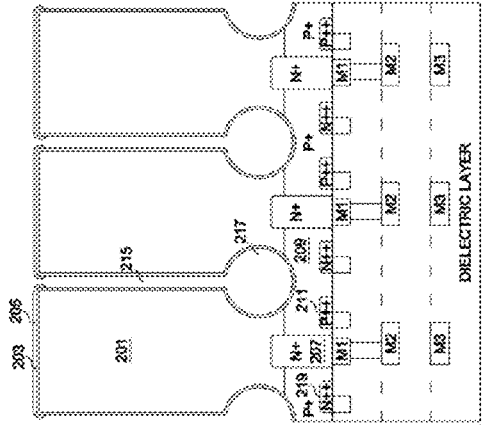

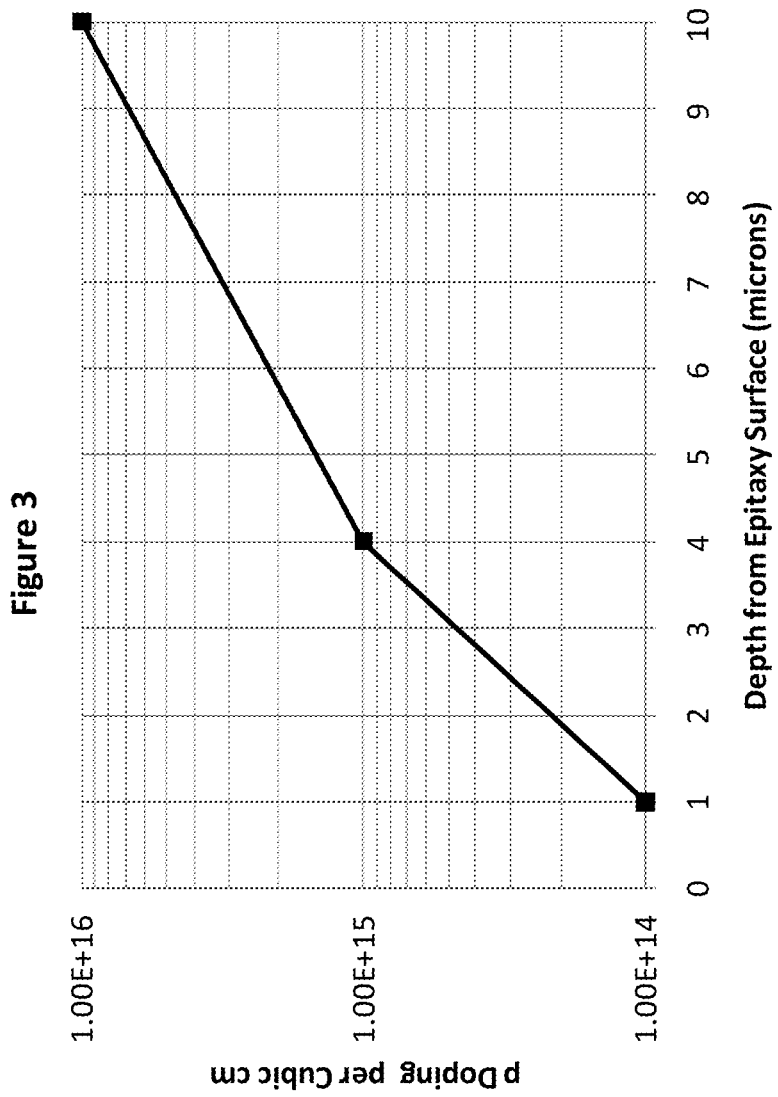

BACKSIDE-THINNED IMAGE SENSOR USING $AL_2O_3$ SURFACE PASSIVATION

RELATED APPLICATION

This Application claims priority benefit from U.S. Provisional Application No. 61/553,097, filed on Oct. 28, 2011, the disclosure of which is incorporated herein by reference in its entirety.

BACKGROUND

1. Technical Field

The present invention relates to thick silicon, backside thinned, image sensors.

2. Related Art

As the size of the image sensors in individual pixels that are part of a sensing array become increasingly smaller, various designs attempt to more efficiently capture the incident light that illuminates the sensing array. One approach that can be used is to collect light from the "backside" of (e.g., underneath) the CMOS image sensor. Using the backside of the image sensor allows photons to be collected in an area that is relatively unobstructed by the many dielectric and metal layers that are normally used to form a typical image sensor. A backside illuminated (BSI) image sensor can be made by thinning the silicon substrate of the image sensor, which reduces the amount of silicon through which incident light traverses before the sensing region of the image sensor is encountered.

Backside-thinned, thick, silicon imagers are typically used in scientific and military applications where the additional sensitivity and performance associated with backside processing justifies the additional processing expense. The two primary advantages of backside processing in conjunction with thick silicon absorber layers are high effective open area ratio even when used with low F# optics and improved absorption of light in the near infra red region of the spectrum (~700-1100 nm). The term thick silicon for the purpose of this discussion is defined as a silicon thickness that exceeds ~½ times the dimension of the pixel pitch and is in excess of ~5 microns of total thickness. When the silicon thickness exceeds the pixel pitch, significant photo-carrier diffusion into adjacent pixels can occur. This carrier diffusion is a well understood trade-off that can be mitigated in a variety of ways. A particularly good discussion of the issue including modeling, data and an alternate method of mitigation is found in US Patent application 2011/0024810 by Janesick. Patent application US 2011/0024810 is therefore incorporated by reference into the present disclosure. Janesick addresses the problem of carrier diffusion via the application of an electric field to a low-doped silicon layer in which the bulk of the near infra-red (NIR) photons (or other photons) are absorbed. Janesick generates the electric field via the application of a bias voltage on the back surface of the backside thinned image sensor. The bias voltage required to generate the photo-carrier drift field is applied to a "Mono-Layer of Metal" deposited on the back surface of the sensor. The applied electric field causes the photo-generated carriers to drift into the proximate charge collection node with minimal cross-diffusion onto adjacent pixels.

Application of a drift field in turn minimizes the charge diffusion associated degradation of image quality. The sharpness of the image generated by silicon CMOS or CCD sensors can be quantified by measuring a sensors modulation transfer function or MTF. MTF is degraded in the absence of an electric field produced via the application of an external bias voltage as disclosed in Patent application US 2011/0024810 or via the incorporation of a doping ramp as shown in FIG. 8 of U.S. Pat. No. 7,005,637 by Costello et al. Although these techniques minimize the MTF degradation associated with photo-carrier diffusion, they do not address optical cross-talk effects that are present in thick silicon detectors particularly when illuminated with low F# optics. When backside thinned silicon image sensors are illuminated with low F# optics the cone of light representing the incoming photons subtends a significant angle; for example a F#=1 simple lens will result in an extreme ray half angle of 45 degrees off the ray normal to the image sensor surface. Although the ray will approach normal as described by Snell's law of refraction, the ray will still retain a significant transverse component with respect to a normal ray. Consequently, there is still a significant mixing of adjacent pixel signals in thick silicon sensors that is not addressed by the incorporation of a drift field. Similarly, un-absorbed light that reaches the front surface of the backside-thinned sensor can reflect off of various interfaces and metal layers at high angles and thereby be absorbed in the silicon underlying adjacent pixels. These optical effects represent an additional undesired MTF degradation mechanism.

It should be noted that the optical cross-talk MTF degradation mechanisms are somewhat dependant on the F# of the incoming light. Consequently, when used in a system that employs an auto-iris lens, the pixel cross talk will change as a function of the lens F# which will in turn vary with scene illumination. While this may be a minor issue for monochrome systems, it complicates the signal processing required for color cameras particularly for extended color space applications that include a NIR channel.

Other isolation techniques applied to backside thinned CMOS imagers include the use of deep trench isolation as detailed by Venezia et al. in U.S. Pat. No. 7,800,192. The deep trench provides both a degree of optical isolation between pixels as well as complete separation of the silicon in which the photoelectrons diffuse. Venzia references multiple embodiments of the deep trench isolated pixel. Most embodiments incorporate a trench that is formed during the standard front-side processing of the device and include a p-well surrounding the trench. The formation of this p-well serves to "passivate" the trench walls, lowering surface generated dark current and the recombination rate of photoelectrons at the trench edge. Passivation of the walls of the trench are critical to the performance of the image sensor. This passivation is easily accomplished during front-side wafer processing via implant and anneal or spin-on-glass diffusion. Deep trench passivation via implant or spin on glass require high temperature processing that cannot be performed after the silicides and metal interconnect lines have been generated. Consequently, these passivation approaches are only applicable to front-side generated deep trenches. Trenches generated from the backside of the sensor must rely on alternate passivation techniques. In FIG. 7 of U.S. Pat. No. 7,800,192 Venzia shows the use of a passivation layer labeled as 740 and described as a p-type implant for passivation. Flat backside surfaces can be implanted and annealed by means such as a short duration laser pulse in order to activate the implant. This pulse-anneal approach allows the thermal budget of a finished CMOS sensor to be met while simultaneously achieving a high quality back surface passivation. Unfortunately, pulse anneal approaches do not work well on deep trenches formed on the backside finished CMOS devices. The pulse power required to activate the p-type dopant deep within the trench exceeds the thermal budget of the sensor.

Venzia does not teach an approach to passivate deep trenches generated on the backside of finished CMOS image sensors. Investigations at Intevac have shown that failure to passivate the vertical surfaces of trenches where the trench surface is more proximate to the photoelectron generation point than the depletion edge of the CMOS imager sense node will result in severe signal loss thereby negating the benefit associated with backside thinning the sensor. Although U.S. Pat. No. 7,800,192 does not call out specific silicon thickness, beyond the 1 to 3 micron thickness callout in FIG. 3, or pixel pitch limits, based on the embodiments that employ the generation of backside deep trenches, the performance of a backside trench approach lacking wall passivation places practical limits on the dimensions over which Venzia's teachings are functional. Specifically, in cases where the un-passivated backside trench depth exceeds the pixel pitch, performance of a backside thinned sensor will be significantly degraded. Similarly, it should be noted that if the depletion region surrounding the sense node of the CMOS imager intersects the unpassivated backside trench, the dark noise of the sensor will be significantly increased. The described shortcomings, signal loss and increased dark current, are significant and the resulting poor sensor performance would disqualify this approach for most commercial and military applications.

The limitations of previously described approaches are best understood when viewed in terms of the design choices that result from the performance requirements of scientific and night vision applications. One common requirement is to simultaneously meet low dark noise, high sensor MTF values and achieve high sensitivity to wavelengths of light ranging from the near ultra-violet (UV) range to NIR light. Scientific sensors may be required to measure light spectra from ~200 nm to ~1.06 micron wavelength. Similarly, military sensors may be required to have color daylight response and high sensitivity to the light available on a moonless star-lit night. In either case, the absorption coefficient of silicon is sufficiently low as to require silicon thickness in excess of 3 microns. More demanding applications may require silicon absorption thicknesses in excess of 50 microns without sacrificing good collection efficiency of the photoelectrons generated near the back surface of the sensor. Typical scientific imager pixel pitches range from the ~5 through ~25 microns. If we take as a basis the example of a scientific sensor with 10 micron pixel pitch and a 30 micron silicon thickness, there would be a ~3:1 aspect ratio of pixel pitch to silicon back surface to sense node distance. If this scientific sensor was fabricated by the approach described by US Patent application 2011/0024810 by Janesick, the sensor would show good response and low dark current but the MTF of the sensor would show significant degradation when illuminated with low F number optics as a result of NIR light optical cross talk. On the other hand, if the sensor were fabricated as described by U.S. Pat. No. 7,800,192, Venzia, with unpassivated deep trenches generated from the back surface of the sensor, MTF would be good but very little visible light signal, generated near the back surface of the sensor, would be collected by the sense node located near the front surface of the sensor.

Recently $Al_2O_3$ has also been investigated as a "surface passivation" approach for crystalline silicon solar cells. It should be noted that for solar cells, surface passivation generally refers simply to surface treatments that enhance cell quantum efficiency over a range of illumination levels consistent with dawn to full sun daylight intensities. Low dark current injection is not typically a solar cell requirement. In stark contrast to the solar cell application, scientific image sensors are required to perform well even in the darkest of conditions. Ideally, the surface passivation of a back thinned scientific image sensor should not result in a significant increase in dark current over the thermal generation limit for the sensors silicon optical absorption layer. Similarly, the recombination rate at the passivated surface should be low compared to the lowest anticipated detectable light level. For sensors used in night vision or scientific microscope applications, detection of light levels that result in a single photoelectron per pixel per frame may be required. Consequently, "passivation" processes that apply to solar cells, though similarities exist, are not necessarily sufficient for application to backside thinned silicon image sensors.

Disclosed embodiments provide a back-thinned silicon image sensor having a passivated back surface. The back surface may include deep trench which are also passivated. According to one aspect, the trenches have a cross section in the shape of long "neck" section leading to an expanded bottom, somewhat like a cross section of a wine decanter. This shape of the trenches forms a choke or funnel for the photoelectrons traveling through the backside silicon towards the photosensitive part of the sensor. A color filter is adhered to the backside. The color filter may include RGB and NIR pixels. The sensor can be used in an EBAPS photosensor. The passivation layer may be $Al_2O_3$, or a combined $Al_2O_3$ layer over a layer of highly doped silicon in the back-thinned silicon image sensor.

Disclosed aspects also provide a back-thinned silicon image sensor passivated with a conformal, low thermal budget passivation layer and incorporating backside etched deep trench geometry to provide pixel level isolation. The sensor may be used in an EBAPS device. A color sensor may be adhered to the passivated backside. The color sensor may include RGB and NIR pixel filters. The conformal passivation may be provided over a highly doped surface of the back-thinned silicon image sensor.

BRIEF DESCRIPTION OF THE DRAWINGS

The drawings illustrate key features of embodiments of the present invention. The drawings do not show all of the details present in a functional design but rather focus on those structures and aspects that distinguish the embodiments from prior art and facilitate improved performance. Numerals contained in the drawings are referenced in the detailed description to further clarify functionality.

FIG. 1 provides example of a section of a sensor during the fabrication process according to disclosed embodiments.

FIGS. 1A-1C are cross sections of a portion of the pixel array of a thick silicon backside thinned image sensor employing deep isolation trenches with passivated sidewalls, while FIG. 1D illustrates a portion of the pixel array having the passivation layer without the trenches, all according to disclosed embodiments.

FIGS. 2A and 2B are cross sections, showing an alternate etch geometry, of a portion of the pixel array of a thick silicon backside thinned image sensor, employing deep isolation trenches with passivated sidewalls, wherein the bottom of the trench is enlarge to thereby create a funnel effect for the photoelectrons, according to disclosed embodiments.

FIG. 3 shows a doping profile for epitaxial silicon suitable for use as a substrate for the fabrication of the backside thinned image sensor, according to disclosed embodiments.

DETAILED DESCRIPTION

Figure 4:
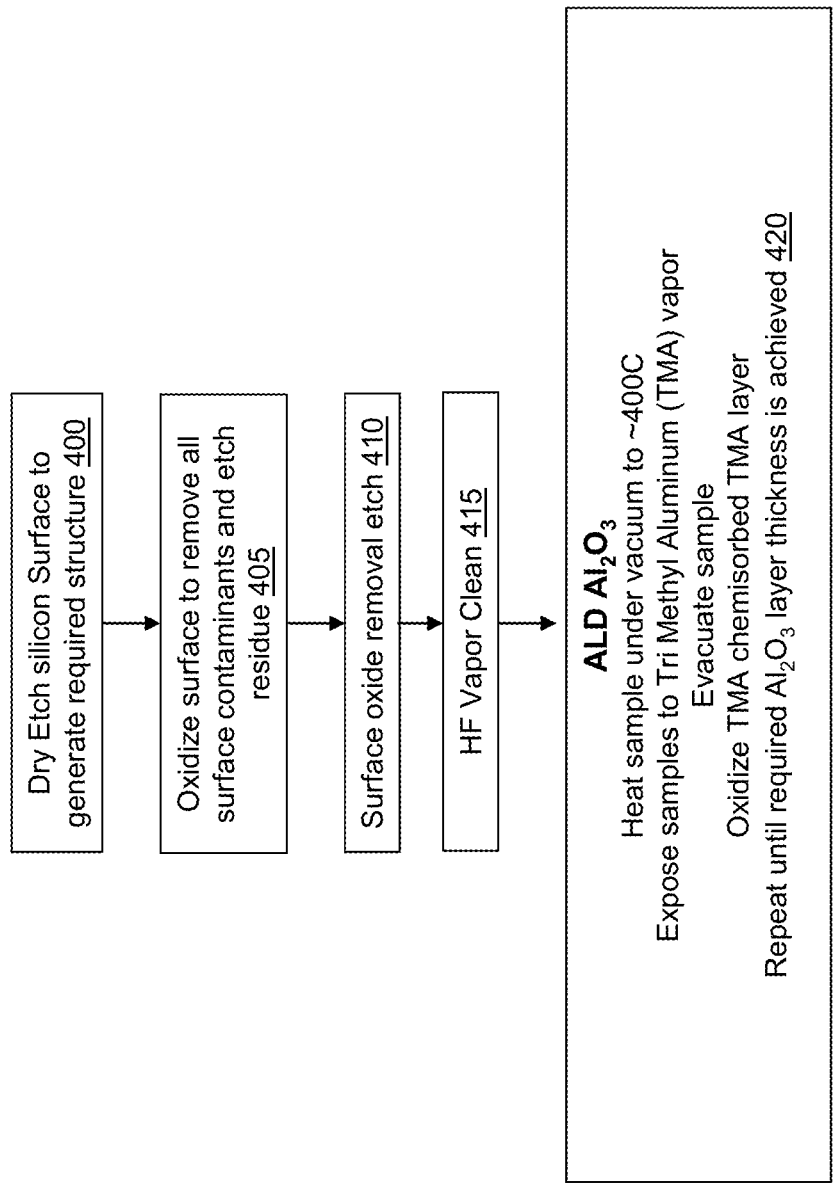
FIG. 4 shows a process flow, compatible with the thermal budget of a finished backside thinned CMOS image sensor wafer, to generate a passivated backside silicon surface according to disclosed embodiments.

The following description provides details to allow one skilled in the art to successfully fabricate the inventive sensor. Those skilled in the art will also recognize that alternate methods and techniques can be used to achieve equivalent results without deviating from the intent of the invention. For example, the following disclosure will focus on CMOS-based image sensors, but it should be recognized that the techniques and structures are applicable to, and will similarly benefit, CCD based image sensors.

Similarly, although the disclosure focuses on silicon image sensors, Si—Ge alloyed image sensors should work with minimal process modifications.

FIG. 1 provides examples of a section of a sensor during the fabrication process according to disclosed embodiments. The sensor has silicon layer 101, which is basically the substrate on which the device layer was fabricated, and is referred to in the art as the backside. In this example the device comprises of a P+ type layer 109, in which N+, N++, and P++ regions are fabricated using, e.g., ion implant or other known methods. The front side of the sensor has alternating layers of dielectric and metal grids. The metal grids are referred to in the art as M1, M2, M3, etch, with the first metal grid being M1. For fabricating a sensor according to the disclosed embodiments, backside layer 101 is first thinned to a desired thickness.

According to one embodiment, illustrated in FIG. 1D, an Al2O3 passivation layer 103 is deposited on the exposed surface of the thinned backside. In one embodiment, the Al2O3 passivation layer is deposited using atomic layer deposition (ALD) process. Optionally, prior to depositing the Al2O3 layer, the top layer 117 of the backside is doped p-type using, e.g., ion implant of boron followed by a flash anneal. Also, optionally, the passivation layer is capped with an anti-reflection coating (ARC) 105. The ARC may be, e.g., a layer of silicon-nitride. The passivation of the thinned backside provides improved performance of the sensor. However, further improvements can be achieved using trenches, which are fabricated in the thinned backside layer, as will be described below.

In the sensors of the disclosed embodiments the deep isolation trenches are fabricated from the backside of the sensor, i.e., the side opposite the sensor's layers. It should be noted that one of the prime advantages of forming and passivating isolation trenches from the backside of the sensor is that much deeper trenches can be generated from the backside than can be incorporated from the front side using standard foundry process modules. Deeper trenches facilitate additional optical absorption length, without a commensurate MTF loss, which in turn allows sensors fabricated with this approach to address applications that are not served via current production techniques. Moreover, the depth of the trench can be designed such that it does not extend into the area of the fabricated sensor elements, i.e., into the p-well.

Prior to backside thinning, silicon image wafers are typically bonded to a support substrate in order to ease the handling of the backside thinned silicon sensor. The front side of the wafer is typically coated with a layer of Silicon Dioxide which is subsequently polished back to generate a flat featureless surface. This flattened front surface of the imager wafer is then mated with a suitably prepared support substrate wafer. Typical support substrate materials include Pyrex glass or silicon wafers. Organic-free methods of bonding the silicon image sensor to the support substrate include anodic bonds, frit bonds and low temperature fusion bonds. A description of a low temperature fusion bond is found in U.S. Pat. No. 6,814,833. A variety of vendors including Suss MicroTec and EV Group provide tools to support wafer bonding.

Fabrication of backside thinned image sensors is well established via a variety of techniques. This disclosure will focus on those approaches that avoid the use of organic adhesives in the fabrication of the backside thinning process so as to preserve the maximal thermal budget for the backside thinned sensor. The use of an organic free process also minimizes the risk of contaminating back-end post processing equipment. Lemonier et al. provides an early description of a backside thinning via chemical means in U.S. Pat. No. 4,687,922. Lemonier makes use of doping level changes to provide an etch-stop near the epitaxy—substrate interface. Other thinning approaches can make use of a buried oxide layer as an etch stop or one can simply control mechanical polishing with sufficient accuracy to achieve a backside thinned silicon wafer. A disclosure of a back-thinned sensor fabricated using an SOI wafer is found in U.S. Pat. No. 6,498,073. A variety of equipment vendors, including Solid State Equipment Corporation, provide systems that can backside thin silicon image sensors at the wafer level via wet-etch.

The residual silicon thickness after backside thinning can fall in a wide range of thicknesses based upon the intended application. The passivated deep backside trench pixel isolation structure is most useful on sensors that require silicon thickness that is greater than or equal to ½ of the pixel pitch. Similarly, the added cost of the backside processing is typically justified only for residual silicon thicknesses larger than about 5 microns. The value of the approach is particularly high for applications where the silicon thickness to pixel pitch ratio exceeds about 3:1.

After backside thinning of the wafer, the bond-pads are accessed via silicon dry etch and dielectric wet-etch processes. Bond pads may be re-metalized as required in order to afford a high quality surface for wire bonding. Similarly, more advanced through-silicon via approaches can be used if the application warrants the additional cost and complication. A silicon dry etch step, possibly the same step used to expose the bond pads, can also be used to expose alignment reticules formed in the metal layers on the periphery of the image sensor. These alignment features are subsequently used in the photolithography step that aligns photo-resist trenches with the pixel boundaries. The photo-resist pattern is then transferred into the silicon via a deep dry etch process such as described in U.S. Pat. No. 5,501,893. Commercial tools are available to support silicon etching process. One example of a silicon etch tool is the Oxford Instruments "PlasmaPro™" System 100.

FIG. 1A shows an embodiment of the present invention where a deep trench, 115, is etched through the silicon absorption layer, 101, to the point where it intercepts a p-well, 109, that was generated during standard front-side image sensor fabrication. Layer 101 can be fabricated from nominally intrinsic silicon, p− doped silicon or may include an engineered doping profile as detailed later in this disclosure and schematically depicted in FIG. 3. This is a desirable configuration in that the p+ dopant will generate an electric field which will minimize photoelectron diffusion between pixels. A suitable pixel design to use with this approach is described in detail within U.S. Pat. No. 6,225,670. An improvement to the pixel design, for this application, is shown in FIG. 1A, i.e., a p++ implant, 111, and an Ohmic contact to a metal bias contact M1 is added to each pixel to provide a consistent, low voltage drop, return path for the holes. This feature is critical to proper pixel operation in the case shown in FIG. 1B, where the deep trench isolates the pixel silicon from the neighboring pixels and may provide more predictable image plane behavior than in the case of FIGS. 1A and 1C, where high photocurrents or image charge currents are present within the back-thinned, deep backside trench isolated, image sensor.

While FIGS. 1A through 1C show embodiments applied to a CMOS image sensor, it is understood that the trench structure shown in FIGS. 1A and 1C could be applied with beneficial outcome to a CCD, or other Silicon based array image sensors. Similarly, although a simple photodiode is shown as the charge collection node, a more advanced partially pinned or fully pinned photodiode can be used. In fact, one of the advantages of generating the passivated isolation trenches from the backside of the sensor is in fact that a wide variety of sensors designed for other purposes can be modified in order to achieve improved performance without incurring the non-recurring charges associated with generating a new mask set. That is, since the etching is done from the backside, the mask design can be the same for difference sensors, regardless of the metal line layers and device structure.

Although the structure shown in FIG. 1A is beneficial from sensor physics, hermaticity and a mechanical robustness point of view, manufacturing tolerances make the structure somewhat difficult to manufacture at high yield. This can be better understood by considering some of the physical dimensions associated with silicon image sensor manufacture. The maximal thickness of layer 109 is dependent upon the implant and anneal schedules qualified for use at a given image sensor foundry. Often, this layer is on the order of one micron thick. The total residual silicon thickness (layer 101+layer 109) after back-thinning is often in the 3 to 50 micron range. The total thickness variation of the back-thinned sensor can exceed ½ micron over the sensor's surface. Similarly depending on the details of the etch geometry, the depth of the deep trench etch, the total etch depth variation can exceed ½ micron. Image sensor yield can be adversely affected particularly if the structure depicted in FIG. 1B is achieved in conjunction with a significant tolerance budget on the X and Y position of the deep trench. Consequently, an endpoint for the deep trench etch may be chosen to achieve the structure in FIG. 1A or 1C even though full MTF performance is not realized in the sensors that meet the structure of FIG. 1B, if etched properly.

Note also that the embodiment of FIG. 1C has the advantage that it inherently defines a silicon back-plate 113 that supports the sensor device elements and insulates or "hermetically" seals the sensor element from the backside. That is, since the trenches 115 are etched from the back and end at a distance from layer 109, a "silicon plate" 113 is defined between layer 109 and the backside area 101 where the trenches are. In this way, silicon plate 113 isolates layer 109 from the area of silicon 101 where the trenches are.

Several techniques can be applied in order to minimize the sensor performance degradation associated with the previously cited manufacturing tolerance budget issues. FIGS. 2A and 2B show alternate trench structures where deep trench 215 is terminated with an expanded etched volume 217. That is, the trench has an elongated section having substantially parallel walls, which leads to an expanded section at the bottom of the trench, such that in cross-section the trench resembles a cross-section of a wine decanter. Those skilled in the art of silicon etch, as described in U.S. Pat. No. 5,501,893, will recognize that structures similar to that shown schematically in FIGS. 2A and 2B can be achieved by greatly extending the final non-polymer forming etch step, such that the bottom section of the trench is expanded by lateral etch of the silicon. FIG. 2A shows the condition where the base of the deep trench intercepts a p-doped layer, 209, but does not extends much beyond the border of layer 209, which is similar to the condition shown in FIG. 1A. FIG. 2B illustrates a condition similar to that shown in FIG. 1C, where the trench is terminated before layer 209 is reached, thereby defining silicon plate 213.

Note that in the embodiments of FIGS. 1A-1C and 2A-2B, the trenches are formed in both X and Y direction, generally referred to in the art as a Manhattan pattern, such that each pixel is further defined by the criss-cross trench pattern. That is, since the trenches are formed in both X and Y directions, the backside is substantially made into islands, each rising above a corresponding pixel. In the embodiments of FIGS. 1A and 2A all of the islands are commonly connected to the active device layer 109, 209, while in the embodiments of FIGS. 1C and 2B the islands are commonly connected to the silicon plate 113, 213. Moreover, when the embodiments of FIG. 2A or 2B are used, a funnel shape is formed at the bottom of each island, as shown in the callout of FIG. 2B. As shown in the callout, each pixel is defined by an island of backside silicon 201 having an inward etched section 233 which forms a photoelectrons funnel. The island is connected at the base to silicon plate 213, which abuts the photosensitive sensor section 209. The silicon plate 213 and photosensitive section 209 expands to the entire device area and is common to all of the pixels, while each backside silicon island is positioned individually above one corresponding pixel.

The potential advantage of this structure, particularly if paired with an engineered doping profile as described in FIG. 3, is that the structure essentially funnels photoelectrons, generated in the volume constrained by the trench, through a choke point 233, defined by the residual silicon volume overlying a pixel and circumscribed by etched volume 217. Ideally, this choke point 233, when viewed from the backside of the sensor is less than or equal to the dimension of the depletion region surrounding the charge collection node 207 while the sensor is integrating signal. When the previous conditions are met, a large fraction of the photoelectrons will be collected in the proper pixel thereby achieving a high value for the sensor MTF.

FIG. 3 shows one possible doping profile that could be used to advantage in conjunction with the structures shown in FIGS. 1A-1D and 2A-2B. One skilled in the art can apply numerous variations to the doping profile shown in FIG. 3, while still following the intent of this disclosure. In order to definitize this example, thicknesses have been assigned that relate to the depth of various features in FIG. 2A. FIG. 3 shows an idealized doping profile where the surface of the epitaxial silicon layer is undoped for the first micron. Since this doping is performed during the epitaxial growth and prior to the fabrication of the sensor elements, the area that will be used for the fabrication of the sensor elements remains undoped. This undoped layer, when applied to FIG. 2A, contains the front surface implants as exemplified by features 219, 207, 211 and 209, which will be formed in later stages of the fabrication. Furthermore, pixel design needs to consider the effect of the doping in the specified doping profile on sense node capacitance and the shape of the resultant depletion region surrounding 207. At a depth of 1 micron a p-dopant such as Boron is introduced at a level of 1E14 per cubic centimeter. The concentration of p-dopant is ramped to achieve a straight line profile on a semi-logarithmic plot as shown. The doping achieves a value of approximately 1E15 per cubic centimeter at a depth of 4 microns. For the purpose of this example the depth of 4 microns represents the maximal depth at which the choke point described in the previous paragraph will occur after accounting for all manufacturing tolerance budget components. The slope of the doping versus depth curve changes and is reduced over the 4 to 10 depth micron range. Once again, for the purpose of this example, 10 microns represents the maximum residual silicon thickness after all components of the back-thinning total thickness variation tolerance budget have been taken into account. The described doping profile has been demonstrated to be sufficient to introduce a meaningful electric field into the silicon substrate. This electric field acts to sweep photoelectrons away from the back surface of the image sensor toward the depletion area surrounding the sense node 207. MTF, time response and other electronic parameters may be optimized for any given sensor geometry through the application of a suitable modeling program.

As can be understood from the embodiments illustrated by layers 103 in FIGS. 1A-1D and 203 in FIGS. 2A-2B, the formation of an effective passivation layer enhances the performance of the imaging device. The term passivation as it is used in this disclosure refers to treating the exposed silicon surfaces that interact with the charge sense node, such that photo-generated carriers are not trapped and annihilated (recombined) by the surface and that the surface does not generate excessive dark current. Although the broader silicon industry may refer to the formation of a native oxide layer as "passivating" the silicon surface, the electrical properties of native oxide surface have been shown to be insufficient in quality for backside thinned image sensor passivation. A number of backside passivation processes have been shown to provide sufficiently low photo-carrier recombination rates and dark current generation rates to support the backside thinned silicon imager application. The passivation approaches broadly can be divided into those that modify the silicon surface and those that form additional material layers over the silicon surface. One approach that has proven to provide a high quality surface passivation is the use of a thin heavily doped surface layer. This layer can be grown on the surface as detailed in U.S. Pat. No. 5,376,810. The '810 patent includes a good technical discussion of the physics involved with surface passivation. Alternate approaches to generate high surface doping levels such as diffusion and ion implant combined with an anneal step have also been shown to provide a low dark current and a low photo-carrier recombination rate. The alternate approach to form a passivation layer involves the formation of a layer on the surface. An example of this approach, as well as a discussion of the physics involved and performance data, is detailed by Janesick in U.S. Pat. No. 5,005,063. On the other hand, the passivation layers shown as layer 103 in FIGS. 1A-1D and 203 in FIGS. 2A-2B, herein are layers that are deposited onto the surface of the silicon.

According to one embodiment, an $Al_2O_3$ layer is applied via atomic layer deposition (ALD) methods in a conformal manner over structured silicon surfaces, and thereby provides a high quality passivation of the silicon surface. The silicon surface was structured via dry etching into columns having nearly vertical sidewalls. The maximum temperature of the deposition was less than 425° C. No degradation to CMOS image sensor performance or functionality was noted as a result of the exposure to the deposition thermal cycle.

A direct comparison of two different passivation approaches performed adjacently on a single back-thinned CMOS imager showed that the $Al_2O_3$ layer achieved ultraviolet (UV) sensitivity greater than that of a surface-doping passivated sensor, indicating a low surface recombination rate was achieved, while simultaneously achieving dark current levels that were indistinguishable from the heavily surface doped passivated region. Further testing showed that the $Al_2O_3$ layer maintained its high quality passivation characteristics after being subjected to the thermal and profiles and other chemical exposures associated with the production of an electron bombarded active pixel sensor (EBAPS®). No degradation in passivation quality was noted during EBAPS® sensor operation.

The passivation layer shown as layer 103 in FIGS. 1A-1D and 203 in FIGS. 2A-2B, can be any low temperature (below ~425 C) conformally applied layer that results in low surface generated dark current and low surface photo-carrier recombination rates. $Al_2O_3$ has been shown to be a suitable passivation layer. The passivation approach disclosed by Janesick in US Patent Application 2011/0024810 may also be effective. Janesick refers to, but does not disclose, the process details associated with a metal monolayer formed by chemisorptions over an ultra thin oxide. A suitable metal, such as platinum, can also be conformally deposited over an ultra thin oxide layer at suitable process temperatures without damaging the oxide layer, so as to form an acceptable passivation layer. It should be noted though that even a single monolayer of metal will absorb some of the light incident upon the backside of the backside-thinned sensor. As part of a properly designed anti-reflection coating, $Al_2O_3$ should show negligible optical absorption. Consequently, all other performance parameters being equal, the $Al_2O_3$ passivation layer is preferred over a metal flash gate approach. It should also be noted that attempts to generate an EBAPS using a flash gate approach where the metal was deposited via evaporation, proved unsuccessful. The flash gate passivation, although quite effective for visible backside thinned image sensors, failed to function effectively after being subjected to EBAPS fabrication process conditions.

FIG. 4 shows a block diagram of a method, according to one embodiment, for silicon surface clean and $Al_2O_3$ ALD process suitable for deposition of the cited passivation layer shown as layer 103 in FIGS. 1A-1D and 203 in FIGS. 2A and 2B. Experiments have shown that proper surface cleaning is critical to the success of the passivation layer. It is believed that surface contaminants and any damaged surface layers must be removed so as to provide a suitable surface for the $Al_2O_3$ ALD process. In step 400, the backside silicon surface is etched to achieve the required thickness of layer 101. The surface of the backside silicon is then oxidized in step 405. At step 410 the oxidized surface is removed, using, e.g., HF dip. IN step 415 the wafer is exposed to HF vapor clean. Thereafter, the ALD process is performed at step 420.

The surface cleaning and ALD process as shown in FIG. 4 proved sufficient to generate low dark current, low surface recombination rate back thinned silicon imagers. It should be noted that the low temperature removal of contaminants and surface damage critical to achieving good surface passivation results using $Al_2O_3$ ALD is very similar to the issues encountered in preparing a silicon surface for low temperature molecular beam epitaxy (MBE). US Patent Application 2011/0140246 details appropriate low temperature silicon MBE surface cleaning methods that are believed to be applicable also to this application. As highlighted in the cited application, the described cleaning techniques should support high throughput and high wafer yield.

A paper that describes suitable $Al_2O_3$ deposition parameters for $Al_2O_3$ on GaAs can be found in "In situ metal-organic chemical vapor deposition atomic-layer deposition of aluminum oxide on GaAs using trimethyaluminum and isopropanol precursors," Applied Physics Letters 93, 031902 (2008). Equipment is now commercially available to perform $Al_2O_3$ ALD. One example of a commercial tool is the Oxford Instruments "OpAL" ALD system. Thermal oxidation of the Tri Methyl Aluminum (TMA) was used for initial successful experiments. Similarly, initial trials deposited layers approximately 100 Angstroms thick which provided suitable surface. FIG. 4 should not be considered to be limiting, clearly, one skilled in the art could, for example, specify a starting matter other than TMA as an aluminum source or optimize the process at a temperature other than 400 C to achieve an equivalent result. Similarly, multiple approaches can successfully be used to oxidize the chemisorbed aluminum containing layer. Materials that have been successfully used as an oxidant for chemisorbed TMA include water, alcohols and oxygen. FIG. 4 simply summarizes one acceptable process.

As shown in step 420 of FIG. 4, after pre-heating to, say 400° C., the ALD process exposes a vacuum evacuated sample to a vapor of TMA or similar aluminum containing molecule. During this step the TMA is adsorbed onto the heated, exposed surface of the sample. The partial pressure of the vapor is chosen such that a single monolayer of the TMA covers the exposed sample surface before the step is terminated. Slightly longer step times may be required on samples with deep trenches or other conductance limiting features. A properly timed TMA absorption step will leave both exposed surfaces and areas deep within the trench with single monolayer coverage of TMA. Upon completion of the TMA chemisorptions, the sample is once again pumped down to a vacuum to remove excess gas-phase TMA. The sample is then exposed to an oxidizing gas. The gas exposure oxidized all of the adsorbed TMA leaving a single monolayer of $Al_2O_3$. Various research papers report that a single ALD chemisorptions and oxidation cycle can deposit between about 0.8 and 1.2 Angstroms of $Al_2O_3$. Current trials have shown that approximately 100-200 cycles of this deposition process show result in a well passivated back thinned silicon image sensor. However, it should be noted that the optimal layer thickness may fall beyond this thickness range (~75-~250 Angstroms). Current experiments show that good results in terms of low surface recombination rates and low surface dark current generation are obtained throughout the 90 to 160 Angstrom range. One can determine and tune up the deposition parameters both by charting passivation quality in terms of dark current generation and surface recombination velocity as well as via cross sectioning devices and measuring $Al_2O_3$ thickness uniformity via scanning electron microscope (SEM) imaging.

Figure 5:
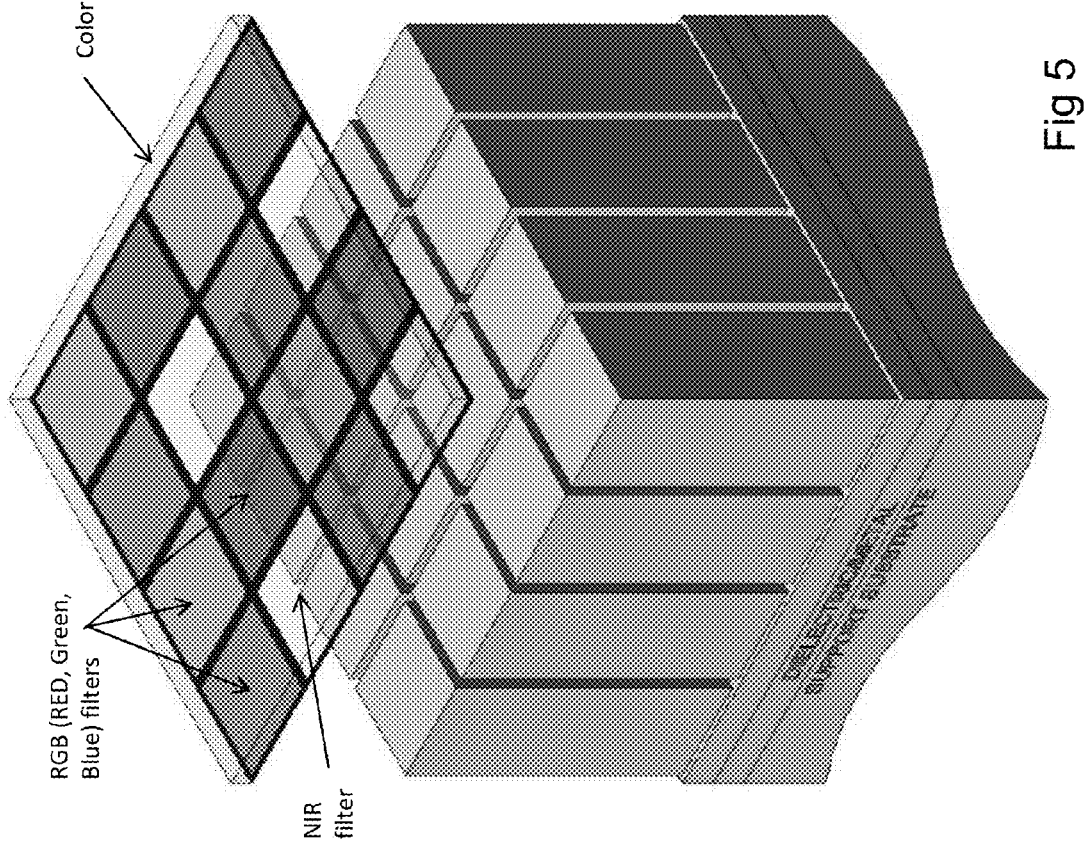
FIG. 5 shows one approach to fabricate a color image sensor from the thick silicon backside thinned image sensor employing deep trench passivated pixel isolation, according to disclosed embodiments.

FIG. 5 shows a sketch of a color filter array before it is mounted in an aligned manner over a portion of an image array fabricated as described in this disclosure. An image color filter array could be patterned with a Bayer pattern or a modification thereof. The use of a color filter array on a transparent substrate eliminates the need to planarize the image array but adds a requirement for an aligned bonding step. The cost of an aligned bonding step after the sensor is diced from the wafer would be unacceptable for high volume commercial products, but may be justified for high performance cameras. The cost tradeoff between the cost of re-planarization and deposition of a color filter array directly on the sensor array versus the bonded and aligned color filter approach shifts toward the bonded approach as the residual silicon thickness is increased. In the case where silicon thickness is in the 30 to 100 micron range, re-planarization becomes particularly difficult; consequently, the bonded color filter array approach is preferred. The filter array may be bonded to the image array via the use of an adhesive. The use of the deep trench isolated sensor could allow improved NIR response and false color imaging including a NIR band. For example, a camera of this type could incorporate a color filter array that sensed the three primary visual colors (RGB) plus a fourth narrow band filter tuned to the 1.06 micron wavelength laser band. A camera of this type would be able to show where the otherwise invisible laser falls within the image. The thick silicon combined with high MTF afforded by this approach would allow the camera to perform the task with good resolution and sensitivity.

Figure 7:
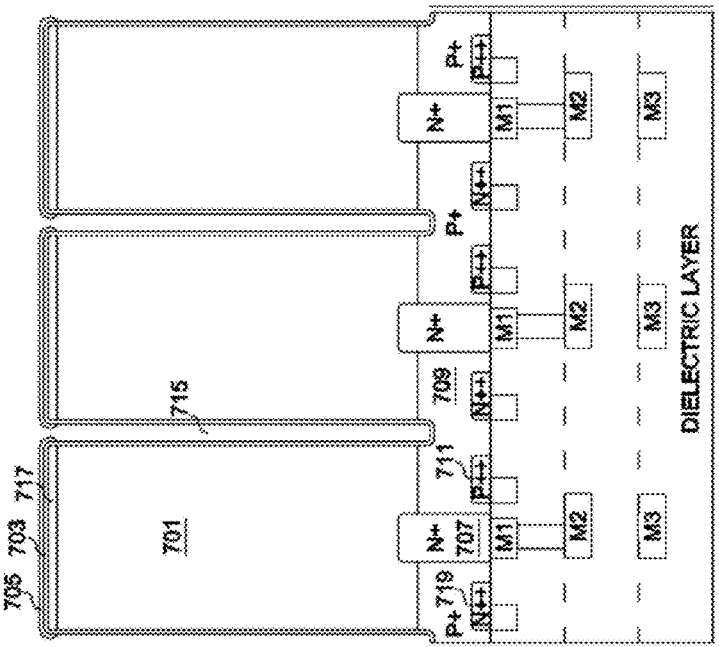
FIG. 7 shows cross section of a portion of the pixel array of a thick silicon backside thinned image sensor employing deep isolation trenches with passivated sidewalls it differs from FIG. 1A in that it includes an additional doped layer 717 between the silicon absorption layer 701 and the conformal surface passivation layer 703, according to disclosed embodiments.
Figure 6:
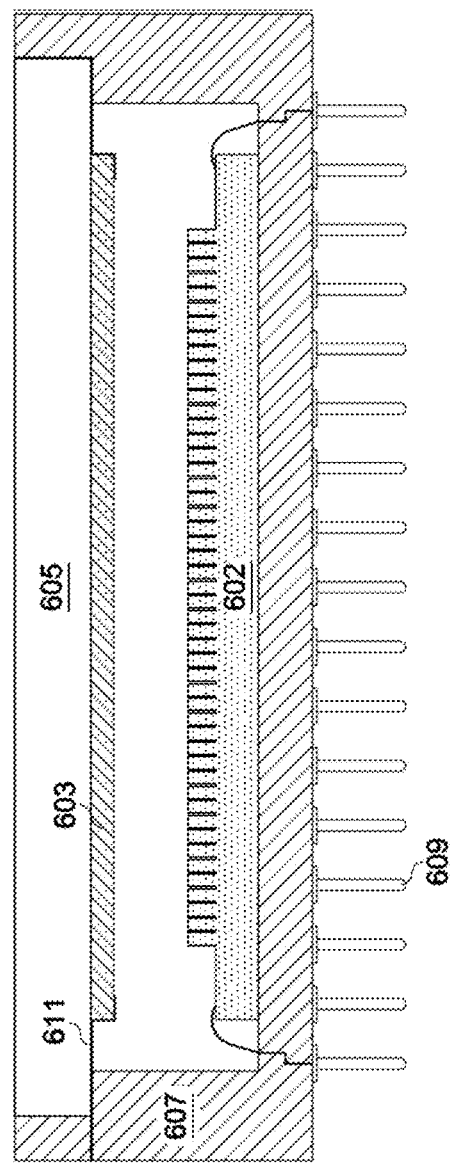
FIG. 6 shows the thick silicon backside thinned image sensor employing deep trench passivated pixel isolation used as an anode in an electron bombarded active pixel sensor (EBAPS®).

FIG. 6 shows a schematic representation of the described deep trench image sensor, 602, incorporated as a subcomponent of an EBAPS®. The Electron bombarded active pixel sensor is described in U.S. Pat. No. 6,285,018. The sensor has found application for military night vision applications. The imaging sensor mounted in the vacuum envelope, 607, is sensitive to both photocathode, 603, generated photoelectrons, and photoelectrons generated by direct absorption of light. The use of the described sensor 602 as the anode of this image tube would allow improved sensitivity via direct light absorption. This can have military utility in that battlefield lasers operating at 1.06 microns would be more visible with this sensor as compared to a thinner silicon image sensor with similar MTF. It should be noted that for the application where the back-thinned sensor deep trench isolated image sensor is used to detect both low energy electrons and light, the sensor as depicted in FIGS. 1, 2 and 7 should be slightly modified. Specifically, the anti-reflection coating, layer 105 in FIGS. 1A-1D, layer 205 in FIGS. 2A-2B, and 705 in FIG. 7, are eliminated so as to increase the sensitivity of the sensor to low energy electrons.

FIG. 7 shows cross section of a portion of the pixel array of a thick silicon backside thinned image sensor employing deep isolation trenches with passivated sidewalls. It differs from FIG. 1A in that it includes an additional doped layer 717 between the silicon absorption layer 701 and the conformal surface passivation layer 703. This variant is listed because during initial trials to develop an $Al_2O_3$ conformal passivation, some samples that used both a doped layer at the surface that were subsequently covered with $Al_2O_3$ showed superior optical sensitivity and electron bombarded sensitivity to either the exclusively doping passivated surface or the exclusively $Al_2O_3$ passivated surface. The layer 717 is shown as a flat non-conformal layer because the current manufacturing method is one of ion implant followed by a flash anneal. This approach is used because it falls within the thermal budget of the back-thinned silicon imager. An ARC layer 705 may be provided on top of the passivation layer 703.

While the invention has been described with reference to particular embodiments thereof, it is not limited to those embodiments. Specifically, various variations and modifications may be implemented by those of ordinary skill in the art without departing from the invention's spirit and scope, as defined by the appended claims.

A back-thinned silicon image sensor passivated using
    Deep trench dependant claims
        EBAPS dependant claims
        Color sensor dependant claim
    EBAPS dependant claims

The invention claimed is:

1. An image sensor, comprising:
a substrate having a side and a backside wherein the backside is to receive incident light;
an array of pixels formed on the frontside, each pixel including a photosensitive region disposed within the frontside of the substrate and a metallization layers disposed over the frontside of the substrate;
an $Al_2O_3$ passivation layer formed over the backside of the substrate; and,
a plurality of trenches extending from the backside towards, but not reaching, the photosensitive region, wherein the trenches are formed in both X and Y direction forming a criss-cross trench pattern, such that each pixel is further defined by the criss-cross trench pattern wherein the backside is substantially made into islands, each rising above a corresponding pixel and wherein the trench isolates each pixel from neighboring pixels; and, wherein portions of the $Al_2O_3$ passivation layer extend into the plurality of trenches.

2. The image sensor of claim 1, wherein each of the trenches comprises an expanded etched volume at the bottom thereof, thereby defining a photoelectrons choke area.

3. The image sensor of claim 1, wherein the substrate comprises a boron doping having gradient of increased doping concentration from the frontside towards the backside.

4. The image sensor of claim 3, further comprising a color filter attached to the backside over the $Al_2O_3$ passivation layer.

5. The image sensor of claim 4, wherein the color filter comprises RGB and NIR filters.

6. The image sensor of claim 1, further comprising a vacuum chamber having a bottom surface and an upper light-transparent surface, wherein the image sensor is attached to the bottom surface and a photocathode is attached to the upper light-transparent surface.

7. The image sensor of claim 1, further comprising a vacuum chamber having a bottom surface and an upper light-transparent surface, wherein the image sensor is attached to the bottom surface and a photocathode is attached to the upper light-transparent surface.

8. The image sensor of claim 1, further comprising a highly doped layer provided in the backside of the substrate at the interface with the $Al_2O_3$ passivation layer.

9. An image sensor, comprising:
a substrate having a frontside and a backside wherein the backside is to receive incident light;
an array of pixels formed on the frontside, each pixel including a photosensitive region disposed within the frontside of the substrate;
a dielectric layer formed over the frontside of the substrate;
a metallization layers disposed in the dielectric layer;
a highly doped layer formed on top of the backside of the substrate;
an $Al_2O_3$ passivation layer formed over the highly doped layer;
a plurality of trenches extending from the backside to towards, but not reaching, the photosensitive region, wherein the trenches are formed in both X and Y direction forming a criss-cross trench pattern, such that each pixel is further defined by the criss-cross trench pattern wherein the backside is substantially made into islands, each rising above a corresponding pixel and wherein trench isolates each pixel from neighboring pixels; and, wherein portions of the $Al_2O_3$ passivation layer extend into the plurality of trenches so as to coat walls of the trenches.

10. The image sensor of claim 9, wherein the substrate comprises a boron doping having gradient of increased doping concentration from the frontside towards the backside.

11. The image sensor of claim 9, wherein each of the trenches comprises an expanded etched volume at the bottom thereof, thereby defining a photoelectrons choke area.

12. The image sensor of claim 9, wherein ratio of thickness of the substrate to pixel pitch exceeds about 3:1.

13. The image sensor of claim 12, wherein thickness of the substrate less the photosensitive region exceeds 5 microns.

14. The image sensor of claim 13, further comprising an anti-reflective coating provided over the passivation layer.

15. The image sensor of claim 9, wherein each of the trenches has a cross-section in the form of a narrow parallel-walls trench extending from the backside towards the photosensitive region and connected to an expanded region provided proximal the photosensitive region.

16. The image sensor of claim 15, further comprising a silicon plate defined between bottom section of the expanded region and the photosensitive region.

* * * * *